(12) United States Patent
Taguchi et al.

(10) Patent No.: US 7,772,295 B2
(45) Date of Patent: Aug. 10, 2010

(54) RESIN COMPOSITIONS, CURED ARTICLE OBTAINED THEREFROM, AND SHEET

(75) Inventors: Koichi Taguchi, Kamakura (JP); Keiji Takano, Kamakura (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 233 days.

(21) Appl. No.: 11/815,401

(22) PCT Filed: Feb. 2, 2006

(86) PCT No.: PCT/JP2006/301791

§ 371 (c)(1),
(2), (4) Date: Aug. 2, 2007

(87) PCT Pub. No.: WO2006/082903

PCT Pub. Date: Aug. 10, 2006

(65) Prior Publication Data

US 2009/0023833 A1    Jan. 22, 2009

(30) Foreign Application Priority Data

Feb. 4, 2005    (JP)    ............................. 2005-028848

(51) Int. Cl.
*C07C 49/84*    (2006.01)
*C08F 2/50*    (2006.01)
(52) U.S. Cl. ........................... 522/153; 522/44; 522/46; 522/127; 525/540; 524/500
(58) Field of Classification Search ................ 522/163, 522/180, 127, 153, 44, 46; 525/540; 524/500
See application file for complete search history.

(56) References Cited

U.S. PATENT DOCUMENTS 6,713,584 B1    3/2004    Chisholm et al.

2004/0106732 A1*    6/2004    Tsuji et al. ..................... 525/94
2004/0202881 A1*    10/2004    Everaerts et al. ............ 428/500

FOREIGN PATENT DOCUMENTS

| GB | 1 507 842 A | 4/1978 |
|---|---|---|
| JP | 58-214209 | 12/1983 |
| JP | 3 139525 | 6/1991 |
| JP | 11 189601 | 7/1999 |
| JP | 11-269438 | 10/1999 |
| JP | 11-292998 | 10/1999 |
| JP | 2000-281997 | 10/2000 |
| JP | 2001 11190 | 1/2001 |
| JP | 2001 194510 | 7/2001 |
| JP | 2002 212376 | 7/2002 |
| JP | 2002-294192 | 10/2002 |
| JP | 2003 255121 | 9/2003 |
| JP | 2004-10859 | 1/2004 |

\* cited by examiner

*Primary Examiner*—Mark Eashoo
*Assistant Examiner*—Jessica Paul
(74) *Attorney, Agent, or Firm*—Oblon, Spivak, McClelland, Maier & Neustadt, L.L.P.

(57) ABSTRACT

To provide a resin composition excellent in conformability to special shapes and in holding power without the need of containing a low molecular softener such as a plasticizer, other than a polysiloxane, and a cured product and a sheet using it.

A resin composition characterized by comprising (a) an acrylic rubber, (b) a compound containing at least two mercapto groups per molecule, (c) a compound containing at least two acryloyl and/or methacryloyl groups per molecule, (d) an acrylate and/or methacrylate having a $C_{2-12}$ alkyl group, and (e) acrylic acid or methacrylic acid. The above resin composition which contains a thermally conductive filler. A cured product and sheet using it.

6 Claims, No Drawings

RESIN COMPOSITIONS, CURED ARTICLE OBTAINED THEREFROM, AND SHEET

TECHNICAL FIELD

The present invention relates to a resin composition, a cured product using it, and a sheet, which are used in the field of electronic equipments and components.

BACKGROUND ART

In recent years, heat release values of electronic components have increased due to high densification and high integration of electronic components, and it has become necessary to cope with such heat. Usually, it is common to employ a method to diffuse such heat by attaching a radiator such as a heat sink, a heat-releasing metal plate or a radiation fin to a heating element such as an electronic component, and various thermally conductive sheets are used to effectively carry out thermal conduction from the heating element to the radiator.

It is widely practiced that one having a thermally conductive filler filled in a curable resin composition, is formed into a sheet, which is used as a thermally conductive sheet for heat dissipation from electronic equipments, etc. (e.g. Patent Document 1).

Patent Document 1 discloses a thermally conductive insulation sheet characterized in that a composition having a thermally conductive filler mixed to a mixture comprising a polysiloxane having C—C bonds in its molecule and an organopolysiloxane having SH groups in its molecule, is formed and crosslinked. However, a material using a polysiloxane is considered to have a problem as an environmental endocrine disrupter.

Further, one having a thermally conductive filler incorporated to a pressure sensitive adhesive such as an adhesive tape is also known (e.g. Patent Documents 2 and 3). In order to efficiently carry out thermal conduction, it is necessary to let components closely contact each other, and adhesion is commonly carried out. However, in an adhesive sheet using such an adhesive, the thickness of the adhesive layer is thin, whereby with components poor in accuracy, it has been impossible to adhere the components closely to each other.

Patent Document 4 discloses a self-supporting thermally conductive sheet excellent in flexibility and releasability, and Patent Document 5 discloses a pressure sensitive adhesive and sheet, wherein even if a thermally conductive filler or flame retardant is incorporated, the flexibility is maintained without deterioration of the adhesive strength. These sheets were flexible, but the thermal conductivity was low at a level of at most 1 W/m·K.

Patent Document 6 discloses a composition for a pressure sensitive adhesive excellent in thermal conductivity and electrical insulating properties, having incorporated a resin having specific molecular weight and acid value, and an adhesive sheet using it. The thermal conductivity and heat resistant holding power were excellent, but the amount of the filler added, was substantial, and there was a problem in conformability to special shapes such as curved surfaces.

Patent Document 1: JP-A-58-214209
Patent Document 2: JP-A-11-269438
Patent Document 3: JP-A-2000-281997
Patent Document 4: JP-A-11-292998
Patent Document 5: JP-A-2002-294192
Patent Document 6: JP-A-2004-10859

DISCLOSURE OF THE INVENTION

Object to be Accomplished by the Invention

It is an object of the present invention to solve the above mentioned problems and to provide a resin composition excellent in conformability to special shapes such as curved surfaces and in heat resistant adhesion holding power without necessity to incorporate a low molecular weight softener such as a plasticizer, other than a polysiloxane, and a cured product using it, and a sheet.

Means to Accomplish the Object

The present inventors have conducted an extensive study and as a result, have found it possible to solve the above problems by a specific resin composition and a cured product using it, and a sheet, and have arrived at the present invention.

Namely, the present invention provides the following:

(1) A resin composition characterized by comprising (a) an acrylic rubber, (b) a compound containing at least two mercapto groups per molecule, (c) a compound containing at least two acryloyl and/or methacryloyl groups per molecule, (d) an acrylate and/or methacrylate having a $C_{2-12}$ alkyl group, and (e) acrylic acid or methacrylic acid.

(2) The resin composition according to the above (1), which further contains (f) a thermally conductive filler.

(3) A resin composition characterized by comprising 100 parts by mass of a resin composition which comprises from 3 to 12 mass % of (a) an acrylic rubber, from 0.01 to 2 mass % of (b) a compound containing at least two mercapto groups per molecule, from 0.01 to 2 mass % of (c) a compound containing at least two acryloyl and/or methacryloyl groups per molecule, from 75 to 94 mass % of (d) an acrylate and/or methacrylate having a $C_{2-12}$ alkyl group, and from 2 to 12 mass % of (e) acrylic acid or methacrylic acid, and from 20 to 300 parts by mass of (f) a thermally conductive filler.

(4) The resin composition according to any one of the above (1) to (3), which contains a photopolymerization initiator.

(5) A cured product which is one obtained by curing the resin composition as defined in any one of the above (1) to (4) and having a hardness of at most 60 as measured after 60 seconds after pressing by means of type E durometer in accordance with JIS K6253.

(6) A sheet made of a cured product obtained by curing the resin composition as defined in any one of the above (1) to (4).

(7) An electronic component using the sheet as defined in the above (6).

Effects of the Invention

The resin composition of the present invention and a cured product using it, and a sheet do not contain a low molecular weight substance such as a low molecular weight siloxane or a plasticizer, and when cured, a cured product having an extremely low hardness can be obtained, whereby it is excellent in conformability to special shapes such as curved surfaces of articles and in holding power.

BEST MODE FOR CARRYING OUT THE INVENTION

Now, the present invention will be described in detail.

The acrylic rubber as component (a) to be used in the present invention is made of at least one member selected from ethyl acrylate, butyl acrylate and methoxyethyl acrylate, and is preferably an acrylic rubber having from 0.01 to 2% of a crosslinkable monomer copolymerized.

The compound containing at least two mercapto groups per molecule as component (b) to be used in the present invention is preferably a substance represented by the formula (1), (2)

or (3) and having a weight average molecular weight of from 50 to 15,000. The weight average molecular weight is a value calculated as polystyrene by GPC (gel permeation chromatography).

$$Z(-SH)_m \quad \text{Formula (1)}$$

$$Z[-O-CO-(CH_2)p\text{-}SH]_m \quad \text{Formula (2)}$$

$$Z[-O-(C_3H_6O)q\text{-}CH_2CH(CH)CH_2SH]_m \quad \text{Formula (3)}$$

In the formulae (1), (2) and (3), Z is an organic residue having m functional groups, and m is an integer of from 2 to 6, and each of p and q is an integer of 0 or from 1 to 3.

Further, the organic residue Z in the formula (1), (2) or (3) is preferably one represented by the formula (4), (5), (6), (7), (8) or (9).

 Formula (4)

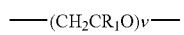 Formula (5)

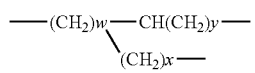 Formula (6)

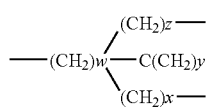 Formula (7)

In the formulae (4) to (7), each of v, w, x, y and z is an integer of from 1 to 6.

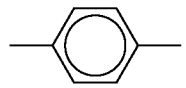 Formula (8)

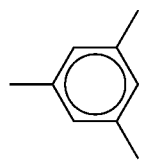 Formula (9)

A polythiol particularly preferred in the present invention may, for example, be a mercapto group-substituted alkyl compound such as dimercaptobutane or trimercaptohexane, a mercapto group-substituted aryl compound such as dimercaptobenzene, a polyhydric alcohol ester of e.g. thioglycolic acid or thiopropionic acid, or a reaction product of an alkylene oxide adduct of a polyhydric alcohol with hydrogen sulfide.

A preferred example of the polythiol may, for example, be triethylene glycol dimercaptan, trimethylolpropane-tris-(β-thiopropionate), tris-2-hydroxyethyl-isocyanurate, tris-β-mercaptopropionate, pentaerythritol tetrakis(β-thiopropionate) or 1,8-dimercapto-2,6-dioxaoctane, but it is not limited thereto.

The compound containing at least two acryloyl and/or methacryloyl groups per molecule as component (c) to be used in the present invention, is preferably a polyfunctional acrylate. For example, ethylene glycol diacrylate, propylene glycol dimethacrylate, 1,6-hexanediol diacrylate, 1,12-dodecanediol diacrylate, trimethylolpropane triacrylate, or pentaerythritol di-, tri- or tetra-acrylate is preferred, and pentaerythritol tetraacrylate is particularly preferred. However, it is not limited to such examples.

The acrylate and/or methacrylate having a $C_{2-12}$ alkyl group as component (d) to be used in the present invention is preferably a $C_{2-12}$ alkyl acrylate and/or methacrylate. For example, ethyl acrylate, propyl acrylate, butyl acrylate, 2-ethylhexyl acrylate, octyl acrylate, isooctyl acrylate, decyl acrylate, decyl methacrylate or dodecyl methacrylate, may be mentioned particularly preferably, but it is not limited to such specific examples.

In the present invention, as component (e), acrylic acid and/or methacrylic acid is used.

In the resin composition of the present invention, the content of component (a) is from 3 to 12 mass %, more preferably from 5 to 10 mass %. If the content of component (a) is less than 3 mass %, it tends to be difficult to obtain a cured product excellent in toughness, and if it exceeds 12 mass %, the viscosity tends to be high, and the operation efficiency tends to be poor.

In the resin composition of the present invention, the content of component (b) is from 0.01 to 2 mass %, more preferably from 0.1 to 1 mass %. If the content of component (b) is less than 0.01 mass %, it tends to be difficult to obtain a cured product excellent in conformability to special shapes such as curved surfaces, and if it exceeds 2 mass %, the chain transfer effect tends to be large, and the curability tends to be poor.

In the resin composition of the present invention, the content of component (c) is from 0.01 to 2 mass %, more preferably from 0.1 to 1 mass %. If the content of component (c) is less than 0.01 mass %, it tends to be difficult to obtain a cured product excellent in toughness, and if it exceeds 2 mass %, the hardness tends to be too much, and it is difficult to obtain a cured product excellent in conformability to special shapes such as curved surfaces.

In the resin composition of the present invention, the content of component (d) is from 75 to 94 mass %, more preferably from 85 to 90 mass %.

In the resin composition of the present invention, the content of component (e) is preferably from 2 to 12 mass %, more preferably from 3 to 10 mass %. If it is less than 2 mass %, the adhesive performance tends to be low. On the other hand, even if it exceeds 12 mass %, there will be no functional problem, but such is undesirable from the viewpoint of safety and hygiene, since the component is a deleterious substance.

The resin composition of the present invention may contain a known polymerizable compound in addition to the constituting components (a), (b), (c), (d) and (e) within a range not to impair the properties desired by the present invention.

Further, during the curing of the resin composition of the present invention, known additives may be added, as the case requires, within a non-influential range. Such additives include, for example, various additives to control the viscosity or viscosity coefficient and other additives such as a modifier, an anti-aging agent, a heat-stabilizer, a coloring agent, etc.

The thermally conductive filler as component (f) to be used in the present invention may, for example, be a metal oxide such as aluminum oxide or titanium dioxide; a nitride such as aluminum nitride, boron nitride or silicon nitride; silicon carbide or aluminum hydroxide, but it is not limited to such specific examples. Further, it includes one surface-treated with e.g. a silane coupling agent.

Thermally conductive fillers may be used alone or in combination as a mixture of two or more of them. Usually, a thermally conductive sheet is required to have a flame retardancy, and aluminum hydroxide is preferred from such a viewpoint that it is capable of improving both properties of the thermal conductivity and flame retardancy.

The average particle size of the thermally conductive filler is preferably at a level of from 1 to 100 μm from the viewpoint of the dispersibility. The amount of the thermally conductive filler to be incorporated may be adjusted depending upon the thermal conductivity required depending upon the particular purpose. The amount of the thermally conductive filler to be incorporated, is usually preferably from 100 to 300 parts by mass, more preferably from 100 to 200 parts by mass, per 100 parts by mass of the resin composition comprising components (a), (b), (c), (d) and (e).

The resin composition of the present invention may be cured by a usual method. For example, it may be cured by a method such as thermal polymerization by means of a thermal polymerization initiator, photopolymerization by means of a photopolymerization initiator or polymerization using a thermal polymerization initiator and a curing accelerator. However, from the viewpoint of the productivity, etc., photopolymerization by means of a photopolymerization initiator is preferred.

The photopolymerization initiator may, for example, be preferably benzophenone, p-methoxybenzophenone, 4,4-bisdimethylaminobenzophenone, xanthone, thioxanthone, chlorothioxanthone, m-chloracetone, propiophenone, anthraquinone, benzoin methyl ether, benzoin ethyl ether, benzoisopropyl ether, benzoin butyl ether, benzyl, 2,2-dimethoxy-1,2-diphenylethan-1-one, acetophenone, 2,2-diethoxyacetophenone, or 2-hydroxy-2,2-dimethylacetophenone. However, it is not limited to such specific examples.

The amount of the photopolymerization initiator to be incorporated is not particularly limited, but it is usually preferably from 0.1 to 2 parts by mass per 100 parts by mass of the resin composition comprising components (a), (b), (c), (d) and (e).

The resin composition of the present invention is cured by e.g. thermal polymerization by means of a thermal polymerization initiator, or photopolymerization by means of a photopolymerization initiator, to obtain a cured product in a gel state. It is important that this cured product is in a gel state and has an extremely low hardness.

As an index for the hardness of the cured product, the hardness as measured after 60 seconds after pressing by means of type E durometer in accordance with JIS K6253, is preferably at most 60, more preferably less than 50. If this hardness exceeds 60, there may be a case where it is not possible to obtain excellent conformability to special shapes such as curved surfaces of articles. Further, if such as hardness is less than 1, there may be a case where sheeting tends to be difficult.

The resin composition of the present invention may be formed into a sheet by a usual method such as casting into a shallow container or application in a prescribed thickness on e.g. a release paper, and by adding and mixing a thermally conductive filler, it is possible to prepare a thermally conductive sheet.

EXAMPLES

The present invention will be described in detail with reference to Examples.

Evaluation Methods (1) Measurement of Hardness

Using a sample in each of Examples and Comparative Examples, the hardness after 60 seconds after pressing was measured by means of E durometer in accordance with JIS K6253.

(2) Maximum Strength and Elongation

Using a sample in each of Examples and Comparative Examples, a dumbell specimen No. 1 was prepared in accordance with JIS K6251, and a tensile test was carried out at a tensile speed of 300 mm/min.

(3) Heat Resistant Adhesion Holding Power

A sheet prepared in each of Examples and Comparative Examples, was cutout into a test specimen having a width of 25 mm, a length of 25 mm and a thickness of 1.8 mm, which was sandwiched between a glass test plate and an aluminum test plate and bonded with a contact area being 25 mm×25 mm, and a roller was reciprocated once on the assembled test plates at a rate of about 300 mm/min for press bonding. Upon expiration of at least 30 minutes, the test plates were left to stand in a constant temperature tank at 100° C., and it was confirmed that the temperature of the test plates became 100° C. Then, one end of the test plates was clamped by a clamp, so that the test plates hanged down vertically. A weight of 500 g or 1 kg was attached to the hanged down end, and the time until it dropped, was calculated.

(4) Thermal Conductivity

A sheet prepared in each of Examples and Comparative Examples, was sandwiched between a TO-3 model copper heater case (TO-3 shape: 6 cm$^2$) and a copper plate, and screw-tightened so that the thickness was compressed 10%. Then, an electric power of 15 W was applied to the heater case until the temperature difference between the heater case and the copper plate became constant, and the temperature difference was measured, and the thermal resistance was calculated by the following formula (10).

$$\text{Thermal resistance (° C./}W\text{)} = \text{temperature difference (° C.)/applied voltage (}W\text{)} \quad \text{Formula (10)}$$

On the basis of the obtained thermal resistance value, the thermal conductivity was calculated by the following formula (11). Here, the thickness of the sample (test specimen) is the thickness at the time of measuring the thermal resistance (thickness when screw-tightened so that the sheet thickness was compressed 10%, and the thermal resistance was measured). Further, the heat transfer area is the TO-3 model heat transfer area of 0.0006 m$^2$.

$$\text{Thermal conductivity (W/m·K)} = \frac{\text{Thickness of sample (m)}}{\text{Thermal resistance (° C./W)} \times \text{Heat transfer area (m}^2\text{)}} \quad \text{Formula (11)}$$

Examples 1 to 11, and Comparative Examples 1 to 6

In accordance with the blend amounts as shown in Tables 1 and 2, an acrylic rubber as component (a) was dissolved in a solution having mixed a compound containing at least two acryloyl and/or methacryloyl groups per molecule as component (c), an acrylate and/or methacrylate having a $C_{2-12}$ alkyl group as component (d) and acrylic acid and/or methacrylic acid as component (e). Further, a thermally conductive filler as component (f) was mixed, and a compound having at least two mercapto groups per molecule as component (b) and a photopolymerization initiator were mixed, to obtain a resin composition.

The obtained resin composition was subjected to defoaming treatment and then applied in a thickness of 1.8 mm on a polyester film having a thickness of 75 μm and having release treatment applied to the surface. The applied surface was further covered by a polyester film having release treatment applied, whereupon ultraviolet rays of 365 nm were applied from the front and rear sides with a dose of 3,000 mJ/cm$^2$, to obtain a cured sheet.

The obtained sheet was cut into sizes corresponding to the purposes of the respective measurements to obtain samples for measurements. Further, for the measurement of hardness, five sheets were overlaid one on another, and the hardness was measured by the above described method.

The results of the respective measurements were shown in Tables 1 and 2.

TABLE 1

| Components | | Ex. 1 | Ex. 2 | Ex. 3 | Ex. 4 | Ex. 5 | Ex. 6 | Ex. 7 | Ex. 8 | Ex. 9 | Ex. 10 | Ex. 11 |
|---|---|---|---|---|---|---|---|---|---|---|---|---|
| Component (a) | AR53L | 6.5 | 6.7 | 6.7 | 6.4 | 6.4 | 6.4 | 6.4 | 6.4 | 6.6 | 6.2 | 0 |
| (mass %)[*1)] | AS3000DR | 0 | 0 | 0 | 0 | 0 | 0 | 0 | 0 | 0 | 0 | 9.4 |
| Component (b) | DMDO | 0.5 | 0.5 | 0.5 | 0.6 | 0 | 0.5 | 0.5 | 0 | 0.9 | 0.4 | 0.5 |
| (mass %)[*1)] | PETP | 0 | 0 | 0 | 0 | 0.6 | 0 | 0 | 0 | 0 | 0 | 0 |
| | HP | 0 | 0 | 0 | 0 | 0 | 0 | 0 | 1.0 | 0 | 0 | 0 |
| Component (c) | HDDA | 0.2 | 0.2 | 0 | 0.4 | 0.2 | 0.2 | 0.2 | 0.4 | 0 | 0.2 | 0.5 |
| (mass %)[*1)] | BEPG-A | 0 | 0 | 0.6 | 0 | 0 | 0 | 0 | 0 | 1.0 | 0 | 0 |
| Component (d) | EHA | 86.6 | 88.3 | 88.4 | 85.3 | 85.5 | 0 | 85.5 | 84.9 | 87.7 | 81.8 | 84.9 |
| (mass %)[*1)] | IOAA | 0 | 0 | 0 | 0 | 0 | 85.5 | 0 | 0 | 0 | 0 | 0 |
| Component (e) | AA | 6.2 | 0 | 3.8 | 7.3 | 7.3 | 7.4 | 7.4 | 7.3 | 3.8 | 11.4 | 4.7 |
| (mass %)[*1)] | MAA | 0 | 4.3 | 0 | 0 | 0 | 0 | 0 | 0 | 0 | 0 | 0 |
| Component (f) | H-32 | 180 | 180 | 180 | 180 | 180 | 180 | 150 | 180 | 180 | 180 | 180 |
| (parts by mass)[*2)] | A-11 | 0 | 0 | 0 | 0 | 0 | 0 | 30 | 0 | 0 | 0 | 0 |
| Photopolymerization initiator (parts by mass)[*2)] | I500 | 0.3 | 0.3 | 0.3 | 0.3 | 0.3 | 0.3 | 0.3 | 0.3 | 0.3 | 0.3 | 0.3 |
| Hardness by type E durometer | | 41 | 33 | 46 | 32 | 42 | 46 | 25 | 58 | 45 | 50 | 60 |
| Maximum strength (MPa) | | 0.6 | 0.36 | 0.75 | 0.48 | 1.02 | 0.95 | 0.45 | 1.49 | 0.37 | 0.6 | 1.29 |
| Elongation (%) | | 355 | 300 | 250 | 400 | 288 | 313 | 513 | 150 | 280 | 925 | 190 |
| Holding power (100° C.) | Load of 500 g (hr) | 36 | 13 | 29 | 27 | 61 | 82 | 25 | 20 | 13 | 45 | 36 |
| | Load of 1 kg (min) | 17 | 7 | 14 | 13 | 29 | 39 | 12 | 10 | 6 | 22 | 17 |
| Thermal conductivity (W/m · K) | | 1.1 | 1.1 | 1.1 | 1.1 | 1.1 | 1.1 | 1 | 1.1 | 1.1 | 1.1 | 1.1 |

[*1)]Total of component (a) + component (b) + component (c) + component (d) + component (e): 100 mass %
[*2)]Parts by mass of component (f) or photopolymerization initiator per 100 parts by mass of the total of component (a) + component (b) + component (c) + component (d) + component (e)

TABLE 2

| Components | | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|
| Component (a) | AR53L | 0 | 0 | 6.5 | 6.7 | 6.8 | 7.0 |
| (mass %)[*1)] | S2012 | 0 | 41.0 | 0 | 0 | 0 | 0 |
| Component (b) | DMDO | 0.5 | 0 | 0 | 0 | 0.5 | 0.5 |
| (mass %)[*1)] | DDT | 0 | 0 | 0 | 1.4 | 0 | 0 |
| Component (c) (mass %)[*1)] | HDDA | 0.2 | 0.1 | 0.2 | 0.2 | 0 | 0.2 |
| Component (d) (mass %)[*1)] | EHA | 92.7 | 56.0 | 85.9 | 88.8 | 89.8 | 92.3 |
| Component (e) (mass %)[*1)] | AA | 6.6 | 2.9 | 7.4 | 2.9 | 2.9 | 0 |
| Component (f) | H-32 | 180 | 50 | 180 | 180 | 180 | 180 |
| (parts by mass)[*2)] | A-11 | 0 | 70 | 0 | 0 | 0 | 0 |
| Photopolymerization initiator (parts by mass)[*2)] | BDK | 0 | 0.1 | 0 | 0 | 0 | 0 |
| | I500 | 0.3 | 0 | 0.3 | 0.3 | 0.3 | 0.3 |
| Hardness by type E durometer | | Precipitated and it was impossible to obtain a uniform cured sheet | 33 | 67 | 8 | Gelled and not measurable, as sheeting was impossible | Gelled and not measurable, as sheeting was impossible |
| Maximum strength (MPa) | | | 0.3 | 4.29 | 0.05 | | |
| Elongation (%) | | | 233 | 125 | 450 | | |
| Holding power (100° C.) | Load of 500 g (hr) | | 7 | No adhesive force | 1.5 | | |
| | Load of 1 kg (min) | | 3 | | 1 | | |
| Thermal conductivity (W/m · K) | | | 0.9 | 1.1 | 1.1 | | |

[*1)]Total of component (a) + component (b) + component (c) + component (d) + component (e): 100 mass %
[*2)]Parts by mass of component (f) or photopolymerization initiator per 100 parts by mass of the total of component (a) + component (b) + component (c) + component (d) + component (e)

ABBREVIATIONS IN TABLES 1 AND 2

AR53L: Acrylic rubber (tradename of Nippon Zeon Co., Ltd.)

AS3000DR: Acrylic rubber (tradename of Negami Chemical Industrial Co., Ltd.)

S2012: 2-EHA type acrylic polymer (functional groups: 6.5 KOHmg/g, tradename of Negami Chemical Industrial Co., Ltd.)

DMDO: triethylene glycol dimercaptan (tradename of Maruzen Chemical Co., Ltd.)

PETP: pentaerythritol tetrakisthiopropionate (tradename of YODO KAGAKU CO., LTD.)

HP: tris-2-hydroxyethyl-isocyanurate.tris-β-mercaptopropionate (tradename of YODO KAGAKU CO., LTD.)

DDT: dodecanethiol (tradename of Kanto Chemical Co., Inc.)

HDDA: hexanediol diacrylate (tradename of Kyoeisha Chemical Co., Ltd.)

BEPG-A: 2-butyl-2-ethyl-1,3-propanediol diacrylate (tradename of Kyoeisha Chemical Co., Ltd.)

EHA: 2-ethylhexyl acrylate (tradename of Toagosei Co., Ltd.)

IOAA: isooctyl acrylate (tradename of Osaka Organic Chemical Ind. Ltd.)

AA: acrylic acid (tradename of Toagosei Co., Ltd.)

MAA: methacrylic acid (tradename of Nippon Shokubai Co., Ltd.)

H-32: Aluminum hydroxide (tradename of Showa Denko K.K.)

A-11: Aluminum oxide (tradename of Nippon Light Metal Company, Ltd.)

I500: 1-hydroxy-cyclohexyl-phenylketone and benzophenone (tradename of Ciba Specialty Chemicals K.K.)

BDK: 2,2-dimethoxy-1,2-diphenylethan-1-one (tradename of Ciba Specialty Chemicals K.K.)

From Table 1, it is evident that sheets of the resin compositions of Examples 1 to 11 all have sufficient flexibility for conformability to special shapes such as curved surfaces and are excellent in the holding power at 100° C.

On the other hand, from Table 2, it is evident that in Comparative Example 1, the filler precipitated, and it was impossible to obtain a uniform sheet; in Comparative Examples 2, 3 and 4, the holding power was poor; and in Comparative Examples 5 and 6, the composition was gelled and so soft that sheeting was impossible.

INDUSTRIAL APPLICABILITY

The resin composition of the present invention and a cured product using it, and a sheet are excellent in conformability to special shapes such as curved surfaces and in holding power, without incorporation of a low molecular weight softener such as a low molecular weight siloxane or a plasticizer, and thus are useful for e.g. applications for heat dissipation or heat transfer as attached to e.g. electronic equipments or components which generate heat.

The entire disclosure of Japanese Patent Application No. 2005-028848 filed on Feb. 4, 2005 including specification, claims, drawings and summary is incorporated herein by reference in its entirety.

The invention claimed is:

1. A resin composition, comprising:
    100 parts by mass of a resin composition comprising:
        from 3 to 12 mass % of (a) an acrylic rubber;
        from 0.01 to 2 mass % of (b) a compound comprising at least two mercapto groups per molecule;
        from 0.01 to 2 mass % of (c) a compound comprising at least two acryloyl and/or methacryloyl groups per molecule;
        from 75 to 94 mass % of (d) an acrylate and/or methacrylate comprising a $C_{2-12}$ alkyl group; and
        from 2 to 12 mass % of (e) acrylic acid or methacrylic acid; and
    from 20 to 300 parts by mass of (f) a thermally conductive filler.

2. The resin composition according to claim 1, wherein the resin composition further comprises a photopolymerization initiator.

3. A cured product which is one obtained by curing the resin composition as defined in claim 1 and having a hardness of at most 60 as measured after 60 seconds after pressing by means of type E durometer.

4. A sheet made of a cured product obtained by curing the resin composition as defined in claim 1.

5. An electronic component comprising the sheet as defined in claim 4.

6. The resin composition according to claim 1, wherein the resin composition further comprises a photopolymerization initiator.

* * * * *